(12) United States Patent
Zhang

(10) Patent No.: US 11,367,478 B2
(45) Date of Patent: *Jun. 21, 2022

(54) INTEGRATED CIRCUIT STRUCTURE AND MEMORY

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/197,051

(22) Filed: Mar. 10, 2021

(65) Prior Publication Data

US 2021/0217462 A1 Jul. 15, 2021

Related U.S. Application Data

(63) Continuation of application No. PCT/CN2020/098521, filed on Jun. 28, 2020.

(30) Foreign Application Priority Data

Jan. 14, 2020 (CN) .......................... 202010036697.X
Jan. 14, 2020 (CN) .......................... 202020082043.X

(51) Int. Cl.
*G11C 5/06* (2006.01)
*G11C 11/4093* (2006.01)
*H01L 23/00* (2006.01)

(52) U.S. Cl.
CPC .......... *G11C 11/4093* (2013.01); *H01L 24/06* (2013.01); *H01L 2224/06515* (2013.01); *H01L 2924/1436* (2013.01)

(58) Field of Classification Search
CPC ................ G11C 11/4093; H01L 24/06; H01L 2224/06515; H01L 2924/1436
(Continued)

(56) References Cited

U.S. PATENT DOCUMENTS 6,097,883 A 8/2000 Dell et al.
6,351,405 B1 2/2002 Lee et al.
(Continued)

FOREIGN PATENT DOCUMENTS

CN 1819196 A 8/2006
CN 101620877 A 1/2010
(Continued)

*Primary Examiner* — Viet Q Nguyen
(74) *Attorney, Agent, or Firm* — Kilpatrick Townsend & Stockton, LLP

(57) ABSTRACT

The embodiments provide an integrated circuit structure and a memory, and relates to the field of semiconductor memory technologies. The integrated circuit structure includes: a pad region, including a plurality of signal pads arranged along a target direction; and a circuit region arranged on one side of the pad region. The circuit region includes a plurality of input/output circuit modules arranged along the target direction and correspondingly connected to the signal pads. Each of the input/output circuit modules is configured to implement a sampling operation of an input signal and write a sampling result into a storage array, and read data stored in the storage array. A size of the circuit region along the target direction is smaller than that of the pad region along the target direction. According to the present disclosure, the performance of a write operation can be improved for the memory.

9 Claims, 3 Drawing Sheets

(58) Field of Classification Search
USPC .......................................................... 365/63
See application file for complete search history.

(56) References Cited

U.S. PATENT DOCUMENTS

| | | | | |
|---|---|---|---|---|
| 8,385,142 | B1* | 2/2013 | Lin | G06F 30/34 |
| | | | | 365/193 |
| 8,804,394 | B2* | 8/2014 | Ware | G11C 29/808 |
| | | | | 365/51 |
| 9,679,613 | B1* | 6/2017 | Sun | G11C 5/02 |
| 9,792,965 | B2* | 10/2017 | Best | G11C 7/1093 |
| 10,360,970 | B1* | 7/2019 | Chang | H03H 7/32 |
| 10,867,690 | B2* | 12/2020 | Kim | G11C 29/42 |
| 10,916,274 | B2* | 2/2021 | Lee | G11C 11/4074 |
| 2006/0039205 | A1* | 2/2006 | Cornelius | G11C 5/066 |
| | | | | 365/189.05 |
| 2007/0162685 | A1* | 7/2007 | Suh | G11C 11/4096 |
| | | | | 711/100 |
| 2011/0317475 | A1* | 12/2011 | Suwa | G11C 5/04 |
| | | | | 365/149 |
| 2012/0206954 | A1* | 8/2012 | Yoshikawa | G11C 5/063 |
| | | | | 365/63 |
| 2013/0141994 | A1* | 6/2013 | Ito | G11C 7/222 |
| | | | | 365/193 |
| 2015/0043298 | A1* | 2/2015 | Hayashi | G11C 5/063 |
| | | | | 365/233.1 |
| 2015/0106538 | A1 | 4/2015 | Vasudevan et al. | |
| 2015/0131388 | A1* | 5/2015 | Ware | G11C 11/4082 |
| | | | | 365/189.02 |
| 2015/0365077 | A1* | 12/2015 | Onda | G11C 11/4093 |
| | | | | 327/108 |
| 2017/0337018 | A1* | 11/2017 | Ooba | H04N 1/00928 |
| 2018/0130739 | A1* | 5/2018 | Miura | H01L 24/02 |
| 2019/0034270 | A1* | 1/2019 | Byun | G11C 29/52 |

FOREIGN PATENT DOCUMENTS

| | | |
|---|---|---|
| CN | 109891586 A | 6/2019 |
| CN | 210805229 U | 6/2020 |
| CN | 210805230 U | 6/2020 |
| KR | 20040107244 A | 12/2004 |

* cited by examiner

US 11,367,478 B2

INTEGRATED CIRCUIT STRUCTURE AND MEMORY

CROSS REFERENCE

This application is a continuation of PCT/CN2020/098521, filed Jun. 28, 2020, which claims priority to Chinese Patent Application No. 202010036694.X, titled "INTEGRATED CIRCUIT STRUCTURE AND MEMORY", and Chinese Patent Application No. 202020082043.X, titled "INTEGRATED CIRCUIT STRUCTURE AND MEMORY" filed on Jan. 14, 2020, the entire contents of which are incorporated herein by reference.

TECHNICAL FIELD

The present disclosure relates to the field of semiconductor memory technologies, and more particularly, to an integrated circuit structure and a memory.

BACKGROUND

With the development of memory technologies, Double Data Rate Fourth Synchronous Dynamic Random Access Memory (DDR4 SDRAM) emerges as the times require. The DDR4 SDRAM has a lower power supply voltage and a higher transmission rate, and a bank group thereon has the characteristics of independently starting operations such as read and write operations. In addition, compared to memories such as DDR3/DDR2, the DDR4 SDRAM not only has fast and power-saving characteristics, but also can enhance signal integrity and improve the reliability of data transmission and storage.

Taking a low-power memory chip LPDDR4 as an example, in the write operation, a data strobe signal (DQS) and a data signal (DQ) are transmitted to the LPDDR4 at an approximately equal speed through a transmission path having an approximately equal length. In the LPDDR4, a DQS input circuit module transmits the received DQS signal as a strobe sample to a DQ input circuit module to collect data. It takes a while to transmit the DQS signal to the DQ input circuit module, which causes the DQS signal to be out of sync with the DQ signal.

To compensate for the time difference between the DQS signal and the DQ signal, the DQS signal may be transmitted in advance. For this reason, in JEDEC standards, a parameter tDQS2DQ is defined to represent the time of advance transmission.

However, the tDQS2DQ tends to be a large value and is susceptible to temperature and voltage interferences on the transmission path, which has a negative effect on the performance of the memory.

SUMMARY

An objective of the present disclosure is to provide an integrated circuit structure and a memory to overcome, at least to a certain extent, the problems of larger tDQS2DQ value and temperature and voltage interferences on a transmission path caused by limitations and defects of related technologies.

According to some embodiments, there is provided an integrated circuit structure, which includes:

a pad region comprising a plurality of signal pads arranged along a target direction; and a circuit region arranged on one side of the pad region, the circuit region comprising a plurality of input/output circuit modules arranged along the target direction and correspondingly connected to the plurality of signal pads, each of the plurality of input/output circuit modules is configured to implement a sampling operation of an input signal and write a sampling result into a storage array, and read data stored in the storage array;

wherein a size of the circuit region along the target direction is smaller than that of the pad region along the target direction.

In some embodiments, the plurality of signal pads include:

a first differential data strobe pad, a second differential data strobe pad, a data mask pad, and a plurality of data input/output pads.

In some embodiments, the pad region further includes:

a plurality of power source pads and a plurality of ground pads.

In some embodiments, the pad region includes:

a first pad subregion and a second pad subregion, the first pad subregion and the second pad subregion comprising an equal number of data input/output pads, and the number being half of the total number of data input/output pads;

wherein the first differential data strobe pad, the second differential data strobe pad and the data mask pad are arranged between the first pad subregion and the second pad subregion.

In some embodiments, the plurality of input/output circuit modules include:

a data strobe input/output circuit module, a data mask input/output circuit module, and a plurality of data input/output circuit modules.

In some embodiments, the circuit region comprises:

a first circuit subregion and a second circuit subregion, the first circuit subregion and the second circuit subregion comprising an equal number of data input/output circuit modules, and the number being half of the total number of data input/output circuit modules;

wherein the data strobe input/output circuit module and the data mask input/output circuit module are arranged between the first circuit subregion and the second circuit subregion.

In some embodiments, the data strobe input/output circuit module is connected to the first differential data strobe pad and the second differential data strobe pad respectively.

In some embodiments, a distance between the adjacent input/output circuit modules is less than a distance threshold.

The distance threshold is determined based on the size of the pad region along the target direction and the size of each of the plurality of input/output circuit modules along the target direction.

In some embodiments, a width-to-depth ratio of the region occupied by each of the input/output circuit modules along the target direction is less than a ratio threshold.

According to some embodiments, there is provided a memory, which includes the integrated circuit structure according to any one of the above embodiments.

In the technical solutions provided by some embodiments of the present disclosure, a size of a circuit region along a target direction is designed to be less than that of a pad region along the target direction. Compared with the existing technologies, in one aspect, a length of a path for transmitting a DQS signal to a DQ input circuit module is reduced, and thus the tDQS2DQ value is reduced. In another aspect, a shorter path can alleviate the temperature and voltage interferences, which can greatly improve temperature and voltage performances and can reduce current consumption, helping to ensure signal integrity and improve memory performance.

It is to be understood that the above general description and the detailed description below are merely exemplary and explanatory, and do not limit the present disclosure.

DETAILED DESCRIPTION

Figure 1:
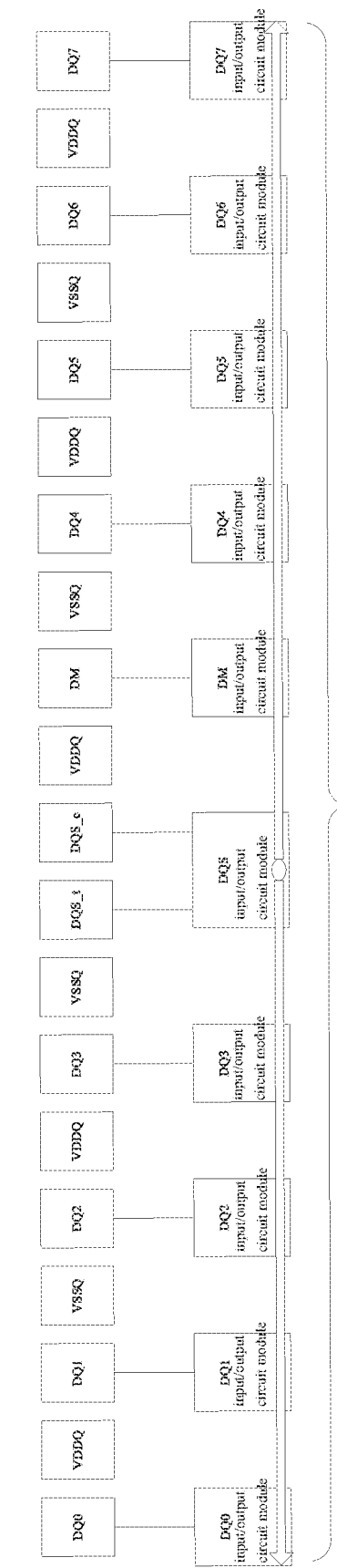
FIG. 1 illustrates a schematic diagram of an integrated circuit structure in some technologies.

Exemplary embodiments will be described more comprehensively by referring to the accompanying drawings now. However, the exemplary embodiments can be embodied in many forms and should not be construed as limited to the embodiments set forth herein; rather, these embodiments are provided so that the present disclosure will be made thorough and complete, and the concept of exemplary embodiments will be fully conveyed to those skilled in the art. Furthermore, the described features, structures, or characteristics may be combined in any suitable manner in one or more embodiments. In the following description, numerous details are provided to provide a thorough understanding of the embodiments of the present disclosure. Those skilled in the art will recognize, however, that the technical solution of the present disclosure may be practiced without one or more of the details described, or that other methods, components, devices, steps and so on may be employed. In other instances, well-known technical solutions are not shown or described in detail to avoid obscuring aspects of the present disclosure.

In addition, the accompanying drawings are merely exemplary illustration of the present disclosure, and are not necessarily drawn to scale. The same reference numerals in the drawings denote the same or similar parts, and thus repeated description thereof will be omitted.

In the process of executing a write operation by a memory such as LPDDR4, a DQ input circuit module may obtain a signal transmitted by a DQ port, and this signal generally is a signal that cannot be directly processed by a digital circuit due to parasitic effects and various interferences. In this case, the DQ input circuit module needs to sample the obtained DQ signal by means of a DQS signal, and the DQ input circuit module writes results obtained by sampling into a storage array.

The DQS signal and the DQ signal almost take the same time to reach the LPDDR4, and inside the LPDDR4, it takes a while for the DQS signal to be transmitted to the DQ input circuit module, which causes the DQS signal to be out of sync with the DQ signal. To avoid this situation, a semiconductor memory chip may transmit the DQS signal to the LPDDR4 one tDQS2DQ in advance, such that the DQS signal and the DQ signal can reach the DQ input circuit module synchronously, to improve the accuracy of sampling the DQ signal by the DQ input circuit module.

However, the tDQS2DQ is susceptible to factors such as internal operating voltage or operating temperature of the LPDDR4. To solve this problem, the tDQS2DQ needs to be adjusted by continuously detecting variations of parameters such as the internal operating voltage and the operating temperature. However, the detection process consumes time and energy, which results in slower write speed, thus having a negative effect on the working performance of the memory.

FIG. 1 illustrates a schematic diagram of an integrated circuit structure in some technologies. In these technologies, the DQ input/output circuit module and a signal pad are manufactured and configured together, such that a path for the obtained DQS signal to reach the DQ input/output circuit module at two ends is long, which is approximate to the length of a region occupied by the signal pad. In the case where the DQ includes 8 bits in total from DQ0 to DQ7, if a corresponding signal pad pitch is 60 μm, the sum of the paths for the DQS signal to reach DQ0 and DQ7 input/output circuit modules is about 1,140 μm. In the exemplary embodiments of the present disclosure, the sum of the paths is denoted as the path corresponding to the tDQS2DQ.

In view of this, if the path corresponding to the tDQS2DQ is shortened, the effects of the factors such as the operating voltage and the operating temperature on the tDQS2DQ are also reduced. In addition, the shortening of the path can also reduce current consumption and help to ensure signal integrity. Thus, the write performance of the memory can be improved.

An integrated circuit structure in one exemplary embodiment of the present disclosure will be described below with reference to FIG. 2.

Figure 2:
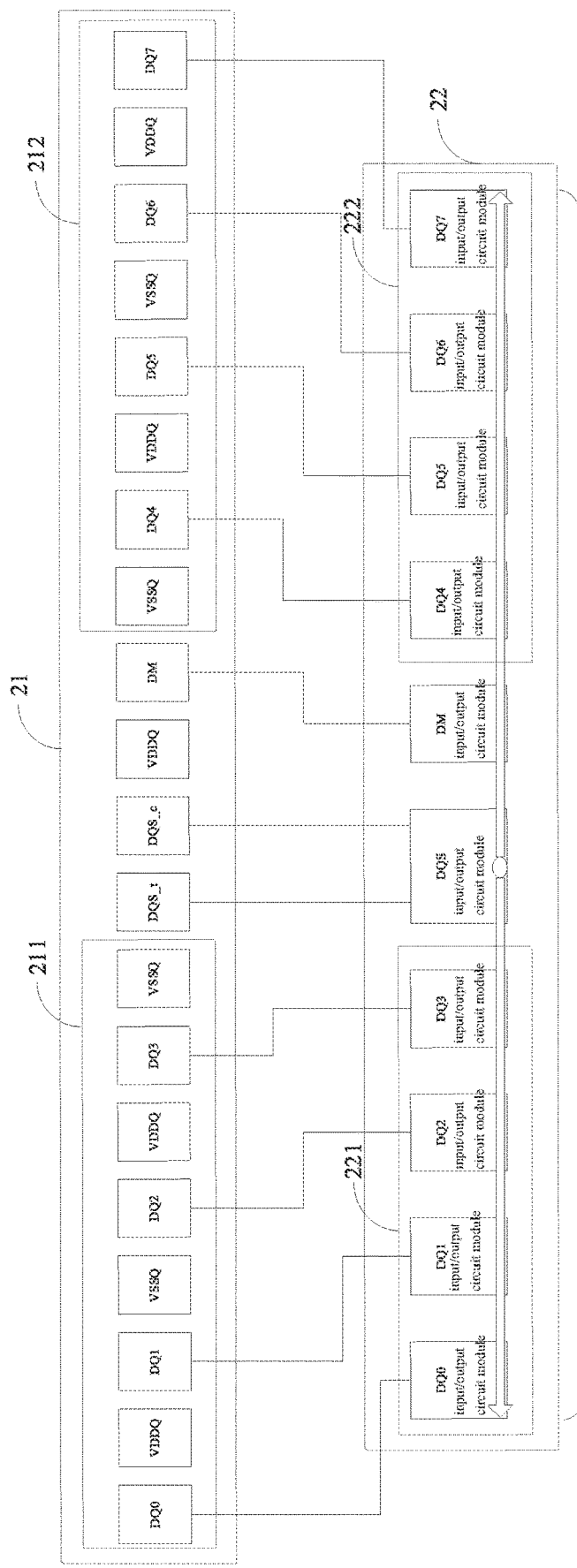
FIG. 2 illustrates a schematic diagram of an integrated circuit structure according to an exemplary embodiment of the present disclosure.

With reference to FIG. 2, the integrated circuit structure may include a pad region 21 and a circuit region 22.

The pad region 21 includes a plurality of signal pads arranged along a target direction, wherein the signal pad refers to a pad corresponding to each data signal port. The signal pad may include but is not limited to a plurality of data input/output pads, a first differential data strobe pad, a second differential data strobe pad, and a data mask pad.

For the plurality of data input/output pads, taking the DQ including 8 bits from DQ0 to DQ7 in total as an example, the plurality of data input/output pads include a DQ0 pad, a DQ1 pad, a DQ2 pad, a DQ3 pad, a DQ4 pad, a DQ5 pad, a DQ6 pad, and a DQ7 pad. However, it is to be understood that the plurality of data input/output pads may also include a total of 16 pads from DQ0 to DQ15, depending on different types of memories, which is not limited in the present disclosure.

The data input/output pad executes the write operation and the read operation synchronously. In the process of executing the write operation, the data input/output pad receives a data signal from a pin through a lead, and transmits the data signal to a corresponding circuit module. In the process of executing the read operation, the data input/output pad receives the data signal from the corresponding circuit module and transmits this signal through the pin.

In a memory above DDR4, a differential data strobe pad may include a first differential data strobe pad (denoted as DQS_t pad) and a second differential data strobe pad (denoted as DQS_c pad). A signal received by the first differential data strobe pad and a signal received by the second differential data strobe pad have the same amplitude and opposite phases. In the process of sampling using a differential signal, a time point at which two differential signals cross may be, for example, a time point of sampling, and the data signal is sampled based on this time point of sampling.

For the data mask pad (DM pad), a mask signal for executing partial write functions may be inputted. When the received mask signal is at a low level, the bit corresponding to the input data will be discarded.

In addition, the pad region 21 may also include a plurality of power source pads (VDDQ pads) and a plurality of ground pads (VSSQ pads) to provide power source and ground terminals.

According to one embodiment of the present disclosure, the pad region 21 may include a first pad subregion 211 and a second pad subregion 212. The number of data input/output pads contained in the first pad subregion 211 is equal to that of data input/output pads contained in the second pad subregion 212, and the number is half of the total number of the data input/output pads. For example, the first pad subregion 211 includes a DQ0 pad, a DQ1 pad, a DQ2 pad, and a DQ3 pad; and the second pad subregion 212 includes a DQ4 pad, a DQ5 pad, a DQ6 pad, and a DQ7 pad.

In this case, the first differential data strobe pad, the second differential data strobe pad and the data mask pad may be arranged between the first pad subregion 211 and the second pad subregion 212, making it easier for a differential data strobe signal to perform path matching on each DQ input circuit module, thereby avoiding the problem of excessive distance difference.

It is to be understood that according to some other embodiments of the present disclosure, any one of the first differential data strobe pad, the second differential data strobe pad and the data mask pad may be arranged on one side of the pad region 21, and their positions with respect to each data input/output pad is not limited.

The circuit region 22 is arranged on one side of the pad region 21. That is, the circuit region 22 and the pad region 21 are two regions without overlapped regions. Corresponding to the plurality of signal pads in the pad region 21, the circuit region 22 includes a plurality of input/output circuit modules arranged along a target direction, and each of the input/output circuit modules is connected to a corresponding signal pad through a metal wire. When executing the write operation, each of the input/output circuit module is configured to sample the input signal and write a sampling result into the storage array. When executing the read operation, each of the input/output circuit module is configured to read data stored in the storage array.

The plurality of input/output circuit modules may include a plurality of data input/output circuit modules, a plurality of data strobe input/output circuit modules, and a plurality of data mask input/output circuit modules.

For the plurality of data input/output circuit modules, corresponding to the plurality of data input/output pads described above, the plurality of data input/output circuit modules may include a DQ0 input/output circuit module, a DQ1 input/output circuit module, a DQ2 input/output circuit module, a DQ3 input/output circuit module, a DQ4 input/output circuit module, a DQ5 input/output circuit module, a DQ6 input/output circuit module, and a DQ7 input/output circuit module.

Each of the DQ input/output circuit modules may be configured to receive a data signal transmitted by the corresponding DQ input/output pad and sample the data signal in response to a data strobe signal to write the sampling result into the storage array.

The data strobe input/output circuit module may be configured to transmit the data strobe signal to each of the DQ input/output circuit modules.

The data mask input/output circuit module may be configured to obtain mask information and execute corresponding partial write operations.

According to one embodiment of the present disclosure, the circuit region 22 includes a first circuit subregion 221 and a second circuit subregion 222. The number of data input/output circuit modules contained in the first circuit subregion 221 is equal to that of data input/output circuit modules contained in the second circuit subregion 222, and the number is half of the total number of the data input/output circuit modules. For example, the first circuit subregion 221 includes a DQ0 input/output circuit module, a DQ1 input/output circuit module, a DQ2 input/output circuit module, and a DQ3 input/output circuit module; and the second circuit subregion 222 includes a DQ4 input/output circuit module, a DQ5 input/output circuit module, a DQ6 input/output circuit module, and a DQ7 input/output circuit module.

In this case, the data strobe input/output circuit module and the data mask input/output circuit module are arranged between the first circuit subregion 221 and the second circuit subregion 222.

In addition, referring to FIG. 2, the data strobe input/output circuit module may be connected to the first differential data strobe pad and the second differential data strobe pad through metal wires.

In the exemplary embodiments of the present disclosure, a size of the circuit region 22 along a target direction is smaller than that of the pad region 21 along the target direction. As described above, the size of the circuit region 22 along the target direction refers to the length of the circuit region 22 along a direction in which the plurality of input/output circuit modules are arranged, i.e., the path length corresponding to the tDQS2DQ.

The size of the circuit region 22 along the target direction is designed to be less than that of the pad region 21 along the target direction. In one aspect, the length of a path for transmitting the DQS signal to the DQ input/output circuit module is reduced, and thus the tDQS2DQ value is reduced. In another aspect, a shorter path can alleviate the temperature and voltage interferences, which can greatly improve temperature and voltage performances and can reduce current consumption, helping to ensure signal integrity and improve memory performance.

According to some embodiments of the present disclosure, in the circuit region 22, a distance between adjacent input/output circuit modules is smaller than a distance threshold. The distance threshold may be determined according to the size of the pad region 21 along the target direction and the size of each input/output circuit module along the target direction, such that the size of the circuit region 22 along the target direction is smaller than the size of the pad region 21 along the target direction. It is to be noted that distances between adjacent input/output circuit modules may be the same or may be different.

As shown in FIG. 2, there may be gaps between adjacent input/output circuit modules to avoid mutual interference between the modules.

In addition, the size of the circuit region along the target direction may be set smaller.

Figure 3:
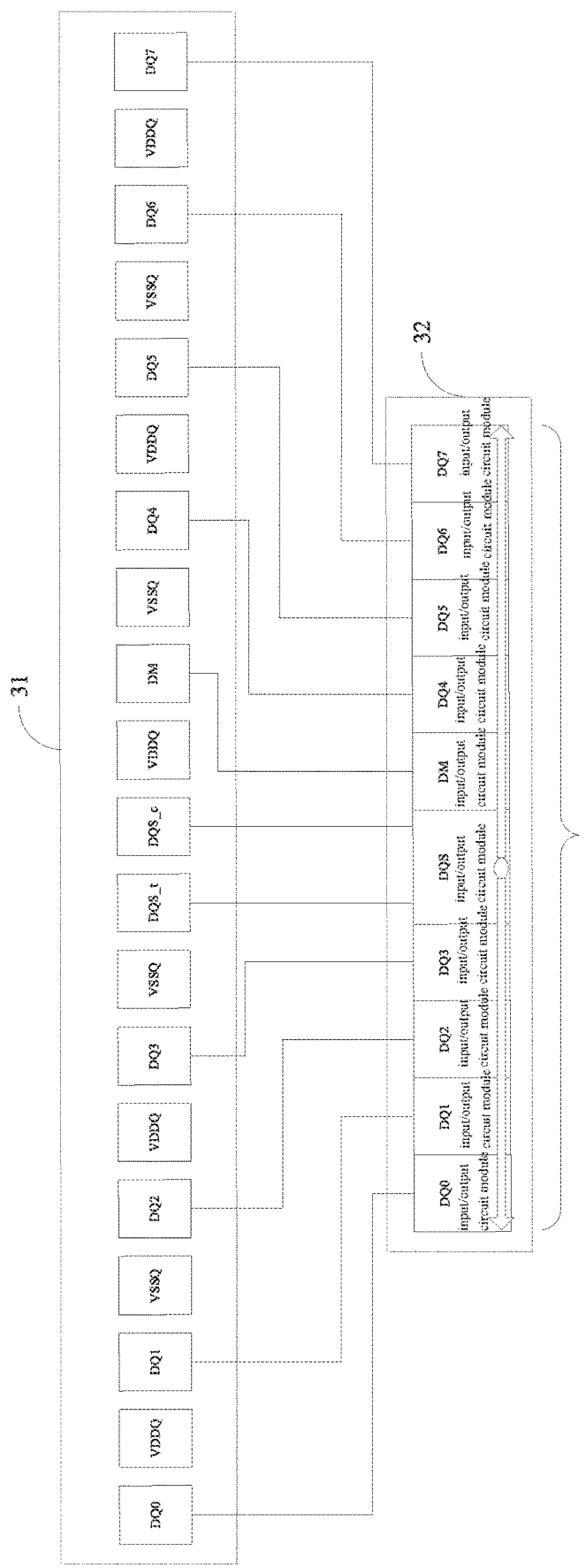
FIG. 3 illustrates a schematic diagram of an integrated circuit structure according to another exemplary embodiment of the present disclosure.

Referring to FIG. 3, the pad region 31 is the same as the pad region 21 in FIG. 2, and thus is not to be described again. For the circuit region 32, the distances between adjacent input/output circuit modules may be as small as possible. That is, the above-mentioned distance threshold may be configured as small as possible. In adjacent structures configured as shown in FIG. 3, the path length corresponding to the tDQS2DQ is further shortened, and more space may be saved in the fabrication processes.

As far as the exemplary structures as shown in FIG. 3 is concerned, the path corresponding to the tDQS2DQ is about 700 µm. Compared with the 1,140 µm in some technologies in FIG. 1, the path length is greatly reduced.

According to some embodiments of the present disclosure, in the integrated circuit structure as shown in FIG. 2 or FIG. 3, a width-to-depth ratio of the region occupied by each of the input/output circuit modules along the target direction is less than a ratio threshold. In one embodiment, the length of each of the input/output circuit modules along the target direction may be configured to be shorter. In order not to have a negative effect on functions of the modules, in this case, the length of each of the input/output circuit modules along a direction perpendicular to the target direction may be appropriately increased. The value of the ratio threshold is not limited in the present disclosure.

In addition, with reference to FIG. 2 or FIG. 3, in the embodiments of the present disclosure, the metal wire from the pad to the input/output circuit module may be configured to be narrow, and thus a large current drive is not required, and input capacitance can be reduced.

The present disclosure also provides a memory, which includes any one of the above-mentioned integrated circuit structures.

It is to be understood that the present disclosure does not limit the type of the memory, which may be a DDR4 SDRAM such as LPDDR4, or may be a DDR5 memory, etc.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof It is intended that the scope of the present disclosure only be limited by the appended claims.

What is claimed is:

1. An integrated circuit structure, comprising:
   a pad region comprising a plurality of signal pads arranged along a target direction; and
   a circuit region arranged on one side of the pad region, the circuit region comprising a plurality of input/output circuit modules arranged along the target direction and correspondingly connected to the plurality of signal pads, wherein each of the plurality of input/output circuit modules is configured to implement a sampling operation of an input signal, write a sampling result into a storage array, and read data stored in the storage array, wherein a size of the circuit region along the target direction is smaller than that of the pad region along the target direction; wherein a width-to-depth ratio of region occupied by each of the plurality of input/output circuit modules along the target direction is less than a ratio threshold.

2. The integrated circuit structure according to claim 1, wherein the plurality of signal pads comprise:
   a first differential data strobe pad, a second differential data strobe pad, a data mask pad, and a plurality of data input/output pads.

3. The integrated circuit structure according to claim 2, wherein the pad region further comprises:
   a plurality of power source pads and a plurality of ground pads.

4. The integrated circuit structure according to claim 2, wherein the pad region comprises:
   a first pad subregion and a second pad subregion, the first pad subregion and the second pad subregion comprising an equal number of data input/output pads, and the number being half of the total number of data input/output pads;
   wherein the first differential data strobe pad, the second differential data strobe pad and the data mask pad are arranged between the first pad subregion and the second pad subregion.

5. The integrated circuit structure according to claim 4, wherein the plurality of input/output circuit modules comprise:
   a data strobe input/output circuit module, a data mask input/output circuit module, and a plurality of data input/output circuit modules.

6. The integrated circuit structure according to claim 5, wherein the circuit region comprises:
   a first circuit subregion and a second circuit subregion, the first circuit subregion and the second circuit subregion comprising an equal number of data input/output circuit modules, and the number being half of the total number of data input/output circuit modules;
   wherein the data strobe input/output circuit module and the data mask input/output circuit module are arranged between the first circuit subregion and the second circuit subregion.

7. The integrated circuit structure according to claim 5, wherein the data strobe input/output circuit module is connected to the first differential data strobe pad and the second differential data strobe pad respectively.

8. The integrated circuit structure according to claim 1, wherein a distance between the adjacent input/output circuit modules is less than a distance threshold;
   wherein the distance threshold is determined based on the size of the pad region along the target direction and size of each of the plurality of input/output circuit modules along the target direction.

9. A memory, comprising an integrated circuit structure, wherein the integrated circuit structure comprises:
   a pad region comprising a plurality of signal pads arranged along a target direction; and
   a circuit region arranged on one side of the pad region, the circuit region comprising a plurality of input/output circuit modules arranged along the target direction and correspondingly connected to the plurality of signal pads, wherein each of the plurality of input/output circuit modules is configured to implement a sampling operation of an input signal, write a sampling result into a storage array, and read data stored in the storage array;
   wherein a size of the circuit region along the target direction is smaller than that of the pad region along the target direction; wherein a width-to-depth ratio of region occupied by each of the plurality of input/output circuit modules along the target direction is less than a ratio threshold.

* * * * *

UNITED STATES PATENT AND TRADEMARK OFFICE
CERTIFICATE OF CORRECTION

PATENT NO. : 11,367,478 B2
APPLICATION NO. : 17/197051
DATED : June 21, 2022
INVENTOR(S) : Liang Zhang It is certified that error appears in the above-identified patent and that said Letters Patent is hereby corrected as shown below:

On the Title Page

Item (30), please correct Foreign Application Priority Data from:
Jan. 14, 2020 (CN)....................... 202010036697.X
To:
Jan. 14, 2020 (CN)....................... 202010036694.X Signed and Sealed this
Seventh Day of May, 2024

Katherine Kelly Vidal
*Director of the United States Patent and Trademark Office*